(12) United States Patent
Fitzgerald

(10) Patent No.: US 11,315,832 B2
(45) Date of Patent: Apr. 26, 2022

(54) WAFER SINGULATION PROCESS CONTROL

(71) Applicant: Rudolph Technologies, Inc., Wilmington, MA (US)

(72) Inventor: Wayne Fitzgerald, Andover, MA (US)

(73) Assignee: Onto Innovation Inc., Wilmington, MA (US)

( * ) Notice: Subject to any disclaimer, the term of this patent is extended or adjusted under 35 U.S.C. 154(b) by 0 days.

(21) Appl. No.: 16/067,748

(22) PCT Filed: Dec. 23, 2016

(86) PCT No.: PCT/US2016/068519
§ 371 (c)(1),
(2) Date: Jul. 2, 2018

(87) PCT Pub. No.: WO2017/117051
PCT Pub. Date: Jul. 6, 2017

(65) Prior Publication Data
US 2019/0019728 A1 Jan. 17, 2019

Related U.S. Application Data

(60) Provisional application No. 62/272,876, filed on Dec. 30, 2015.

(51) Int. Cl.
*H01L 21/78* (2006.01)
*H01L 21/66* (2006.01)
(Continued)

(52) U.S. Cl.
CPC .............. *H01L 21/78* (2013.01); *G06T 7/001* (2013.01); *G06T 7/13* (2017.01); *H01L 22/12* (2013.01);
(Continued)

(58) Field of Classification Search
CPC .................... H01L 21/78–786; H01L 21/3043
See application file for complete search history.

(56) References Cited

U.S. PATENT DOCUMENTS

| | | |
|---|---|---|
| 5,710,825 A | 1/1998 | Suda |
| 6,192,289 B1 | 2/2001 | Geffen et al. |
| | (Continued) | |

FOREIGN PATENT DOCUMENTS

| | | | |
|---|---|---|---|
| JP | 03236260 A | 10/1991 | |
| JP | 05326700 A | 12/1993 | |
| | (Continued) | | |

OTHER PUBLICATIONS

Search Report and Written Opinion for related International Application No. PCT/US2016/068519 dated Apr. 17, 2017 (9 pages).
(Continued)

*Primary Examiner* — Dale E Page
*Assistant Examiner* — Wilner Jean Baptiste
(74) *Attorney, Agent, or Firm* — Dicke, Billig & Czaja, PLLC

(57) ABSTRACT

A method for monitoring and controlling a substrate singulation process is described. Device edges are imaged and identified for analysis. Discrepancies in device edges are noted and used to modify a singulation process and to monitor the operation of singulation processes for anomalous behavior.

18 Claims, 4 Drawing Sheets

(51) Int. Cl.
  *G06T 7/13* (2017.01)
  *G06T 7/00* (2017.01)
  *G06T 7/55* (2017.01)
  *G06T 7/73* (2017.01)
  *G06T 7/33* (2017.01)

(52) U.S. Cl.
  CPC ............ *H01L 22/20* (2013.01); *G06T 7/33* (2017.01); *G06T 7/55* (2017.01); *G06T 7/74* (2017.01); *G06T 2207/20212* (2013.01); *G06T 2207/30148* (2013.01)

(56) References Cited

U.S. PATENT DOCUMENTS

| | | | |
|---|---|---|---|
| 6,768,332 B2* | 7/2004 | Lin | G01R 31/2884 324/750.23 |
| 6,972,202 B2* | 12/2005 | Nishihashi | G01R 31/2886 438/17 |
| 9,165,832 B1 | 10/2015 | Papanu et al. | |
| 2002/0114507 A1 | 8/2002 | Lynch et al. | |
| 2005/0003633 A1* | 1/2005 | Mahle | H01L 21/02016 438/463 |
| 2005/0009302 A1 | 1/2005 | Wakui et al. | |

FOREIGN PATENT DOCUMENTS

| | | |
|---|---|---|
| JP | 06-80728 | 10/1994 |
| JP | 06326187 A | 11/1994 |
| JP | 2011-061069 A | 3/2011 |

OTHER PUBLICATIONS

Supplementary European Search Report Application No. EP 16882467 dated Jul. 18, 2019 (11 pgs).

* cited by examiner

WAFER SINGULATION PROCESS CONTROL

TECHNICAL FIELD OF THE INVENTION

The present invention relates generally to the fabrication of electronic and integrated circuit devices.

BACKGROUND OF THE INVENTION

The fabrication of electronic devices and particularly integrated circuit devices takes place in a bulk fashion with multiple such devices being formed simultaneously on a single substrate. Substrates of various sizes, shapes, and compositions are common. Examples of materials from which substrates may be formed may include, but are not limited to, silicon, sapphire, gallium-arsenide, glass, plastics, epoxies, and various composites, composite structures or compound semiconductors formed from any of the foregoing or their like.

Once the fabrication of devices on a substrate is complete, these devices must be separated from the substrate. Separating electronic or IC devices from one another is referred to as singulation. Often this is accomplished by first adhering the substrate to a support or backer so that when the devices are separated from one another, their location remains known. Supports may include film or tape frames as well as secondary substrates of the same or different type as the substrate that is to be separated into multiple, single devices. Separation is accomplished by many methods known to those skilled in the art including, but not limited to, sawing and scribing. In a sawing operation, a thin diamond saw is passed through the substrate between devices to separate them from one another. The saw is intended to cut the substrate but not the support to which the substrate is mounted. Similarly, a scribing operation may use a mechanical or laser scribing tool to create a scribe line on the substrate between devices that are to be separated. In a scribing operation, however, the scribed substrate is broken along the scribed lines to separate the individual devices. In both operations, the now-separated devices remain adhered to the support so that they are available for subsequent fabrication or packaging operations.

In order to properly control the singulation operation, one is required to characterize the current results in light of past settings and arrangements. This characterization can then be used to modify ongoing processes, to predict apt settings for the singulation process and/or to identify emergent characteristics of an ongoing singulation process that are positive or negative. One oft-employed manner of characterization of the singulation operation involves the application of machine vision techniques. However, these approaches often require the application of complicated image processing techniques to extract information useful for the characterization of the singulation operation. Accordingly, there is a need for simplified techniques for extracting information from images of substrates and singulated devices.

SUMMARY

In one embodiment of the present invention, a singulation process is monitored and at least in part controlled based on the assessment of features found in images of singulated IC devices captured by an inspection system. In these images, the peripheral edges of the devices may be identified and segments of these edges may be compared to segments of edges of adjacent devices to identify discrepant portions of these edge segments. Discrepancies that are of interest may include, but are not limited to, roughness, chips, delaminations, and misalignment. This same technique can be used to determine whether the separated edges of an IC device are properly positioned and aligned with the edges of a central portion of the IC device. Singulation process variables such as feed rates, temperatures, pressures, and alignment may be modified accordingly.

DETAILED DESCRIPTION

Figure 1:
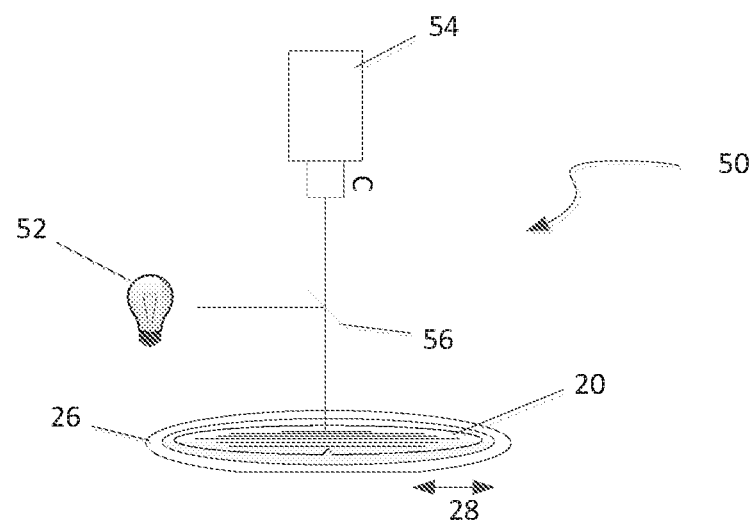
FIG. 1 is a schematic illustration of a general purpose machine vision system for capturing images of a substrate.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a generic machine vision system 50 used for capturing images of a substrate 20. The system 50 includes a source of illumination 52, which is in this case arranged in a bright field illumination scheme, and an imager 54, most often a digital camera that includes a charge-coupled device (CCD) or a complementary metal-oxide semiconductor (CMOS) type image sensor located at an image plane of the vision system 50. A beam splitter 56 couples the source 52 into the normal incidence optical path of the system 50 so that light from the source 52 is incident upon the substrate 20 and then returned from the substrate 20 to the imager 54, which forms an image from light returned from the substrate 20. Optical elements (not shown) of types known to those skilled in the art are associated with the source 52 and the imager 54 to ensure that the illumination from the source 52, object (substrate 20) and the sensor of the imager 54 are conjugate with one another to produce a properly focused and exposed image. Such optical elements may include lenses, objectives, filters (wavelength and intensity), polarizing filters, spatial filters, beam shapers, mirrors (with or without power) and the like.

Those skilled in the art will appreciate that while a normal incidence system 50 is illustrated and described, additional or alternative imaging systems are also contemplated. For example, an alternative or optional source of illumination (not shown) may be provided to direct light onto the substrate 20 to facilitate what is commonly referred to as a dark field imaging scheme. Any suitable number of sources 52 of bright field or dark field illumination may be provided. Imager 54 may be provided with more than one image sensor to take advantage of various illumination schemes. Further, sources 52 may be arranged at one or more angles of incidence and/or azimuth with respect to the substrate 20.

Depending on the arrangement of source(s) 52 and the sensor(s) of imager 54, resulting images may encode various characteristics of the substrate 20 that are of interest in controlling a singulation process. Images output by the imager 54 are generally pixel based, being comprised of an array of pixel values that when rendered as an image, faithfully represent the characteristics of the substrate 20 that are of interest. Pixels of a digital image are mapped to a corresponding location of the substrate 20 and the numeric value of each pixel is representative of the light returned from that location of the substrate 20 by reflection, refraction, scattering, or emission. Pixel values often relate a basic intensity of light sensed by the imager 54 but may also relate data that is correlated to characteristics of the substrate in various wavelengths, polarization states, angles of incidence and/or azimuth, or scattering intensity.

Images obtained from the system 50 are provided to a controller (not shown) that is adapted for analyzing the obtained images. The controller may be a local or networked computer or processor of any useful configuration operating in local or remote modes of operation.

The substrate 20 seen in FIG. 1 represents a silicon wafer 22 that is mounted on a support 26, in this case a film frame having a circumferential ring with a central aperture that is covered by a film or tape to which the wafer 22 is adhered. The substrate 20 is moved (arrow 28) relative to the system 50 to permit the capture of images of all or a portion of the substrate 20 in its whole or singulated state. Motion of the substrate is provided by a stage or platform (not shown) of a type known to those skilled in the art. While linear motion is suggested by arrow 28, curvilinear motion such as that caused by rotation of a substrate 20 is also contemplated. Scanning of an entire substrate is often conducted by moving the substrate along a boustrophedon or spiral path past the imager 54. Piecewise or sampled imaging may also be carried out.

Figure 2:
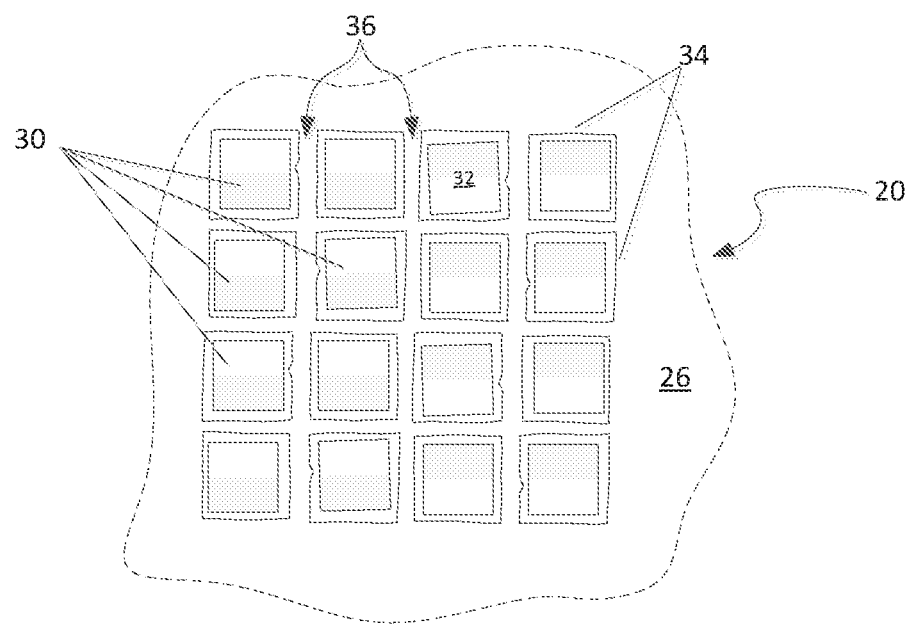
FIG. 2 illustrates a portion of a substrate having multiple devices formed thereon, the devices being affixed to a support and having been separated from one another.

FIG. 2 illustrates a portion of a substrate 20 that has been singulated. Individual IC devices 30 are positioned in a generally ordered, rectangular array, though it is possible to arrange such devices 30 in different geometric patterns. In general, devices 30 are characterized by a central area 32 that includes some circuitry or other structure such as micro-electromechanical structures (MEMS). Each device has a peripheral edge 34 that surrounds the central area 32 and which is spaced apart therefrom by a predetermined amount to ensure that the circuitry or structure of the central area 32 is not damaged by the singulation process. As alluded to above, singulation is accomplished by running a saw blade or scribe (laser or mechanical) between the rows and columns of devices 30. This space is often referred to as a "street" on account of the fact that the rectangular array of devices 30 often looks like a map of a city with blocks corresponding to devices 30 and the spaces between the devices appearing to be city streets. For the sake of brevity only singulation by sawing will be described herein though it is to be understood that singulation by other methods are fairly similar and are encompassed by this description.

Figure 3:
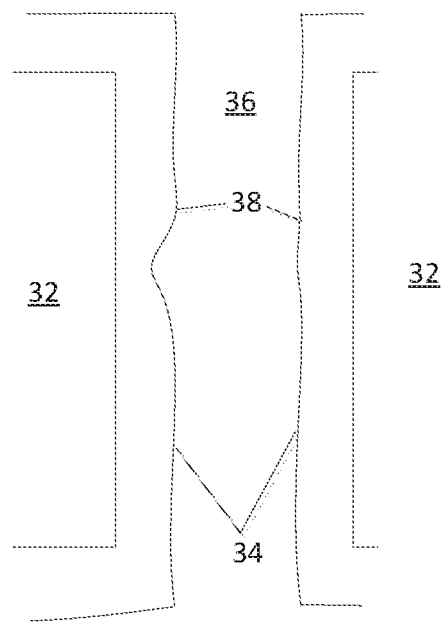
FIG. 3 illustrates a common geometry in singulated devices, including discrepant portions.

A saw blade (not shown) is passed between devices 30 in the "streets" 36 between the rows and columns of the devices 30. The streets 36 are considered waste areas in that they are to be destroyed during singulation. Various process control and testing structures may be formed in the streets 36 during fabrication of a device-containing substrate 20, but these are generally destroyed by the singulation process. In FIG. 3, a street 36 and the peripheral edges 34 that define it are more clearly seen. In this Figure, one is also able to discern a single edge segment 38 of the peripheral edge 34 of the singulated device 30. Multiple segments 38 together form the peripheral edge 34 of the device 30. The segments 38 may be any arbitrary portion of the peripheral edge 34 that, taken together with a corresponding segment 38 from an adjacent device 30, defines or delineates a saw cut in the street 36. An edge segment 38 in one embodiment extends along an entire side of a nominally rectilinear device 30, i.e. a side of a rectangular or square device 30.

In FIG. 3, the segments 38 are shown as being generally linear in nature. In most cases singulation is a linear process and segments 38 are nominally linear as well. However, saw cuts in the street 36 can deviate from a linear path for a number of reasons and accordingly, the segments 38 of edges 34 are illustrated in an exaggeratedly curvilinear fashion.

Figures 4A, 4B:
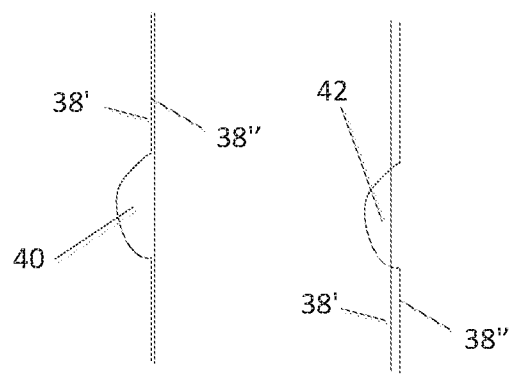
FIGS. 4A and 4B are schematic representations of one method of identifying discrepant portions of singulated devices.

FIGS. 4A and 4B illustrate two types of discrepancies that can occur during the singulation process. In FIG. 4A, adjacent segments 38' and 38" are overlaid to visually amplify any discrepancies as between the respective segments. As can be seen, segment 38' has an edge portion that deviates away from segment 38". The segments 38' and 38" do not intersect at any point along their lengths. Where segments 38 are overlaid and a gap 40 is formed without the segments intersecting, one can presume that a portion of the segment 38' in which the gap 40 is formed has a chip or is otherwise missing some material.

In FIG. 4B, the segments 38' and 38" are again overlaid to visually amplify any discrepancies therebetween. In this example, segment 38" has a gap 42 that extends towards and across segment 38'. Where a segment such as segment 38" has a gap 42 that extends towards and intersects its corresponding segment 38', one can presume that there a portion of edge 38" has what is referred to as a delamination. In this situation, a portion of the edge segment 38" has lost some material or had a crack form therein such that there is a defect in the device 30 at its peripheral edge that does not extend entirely through the substrate 20 from top to bottom.

As one might expect, the existence and positions of each device 30 and its peripheral edges 34 are determined from images obtained from the system 50. The controller attached to the system 50 analyzes the captured images and identifies the position of the peripheral edges 34 of each device 30. Depending on the resolution, the imaging system 50, and its numerical aperture, the field of view captured by the imager 54 may include multiple devices 30, a single device 30, or portion of one or more devices 30. As the present invention relates to the assessment of adjacent segments 38 of the peripheral edges 34 of the devices 30, an exhaustive review of how images may be parsed to permit analysis is not included herewith. Suffice it to say that it is well known to those skilled in the art to sample images that include multiple regions of interest to obtain images of comparable segments 38. Similarly, it is well known in the art to select portions from discrete images for comparison or to concatenate multiple images to obtain images having more visual information concerning a device 30 or segments 38 that might be derived therefrom.

In one embodiment, segments 38' and 38" are imaged by system 50. Segments 38' and 38" may be identified within the captured image using a technique similar to that described in U.S. Pat. No. 5,696,835 entitled "Apparatus and method for aligning and measuring misregistration". This reference is hereby incorporated by reference in its entirety. A line of best fit of each of the segments may be determined and then used to 'overlay' the segments 38' and 38". In one embodiment, this may be done by generating a transform that relates the position and orientation of the segments 38' and 38", the one to the other. In another embodiment, a composite image (as used herein, the term 'image' may mean an actual digital image as well as an array of pixel information) is generated superimposing the segments 38' and 38" over one another. In all instances, the orientation of the segments 38' and 38" is maintained to preserve information related to the quality of the singulation process.

"Overlaying" the segments is not something that has to be done directly. Simply knowing the position of pixels that form the segments, or the formula that identifies the line of best fit or the data that underlies the image primitive that has been identified should allow one to perform the subsequent identifying step. "Overlaying" is a step that simply involves forming a known relationship between the profiles that permits the subsequent discrepancy identification step to take place. This can be a simple transform or the formation of a new image from two separate images or the direct relation of image primitives.

Figures 6A, 6B, 6C:
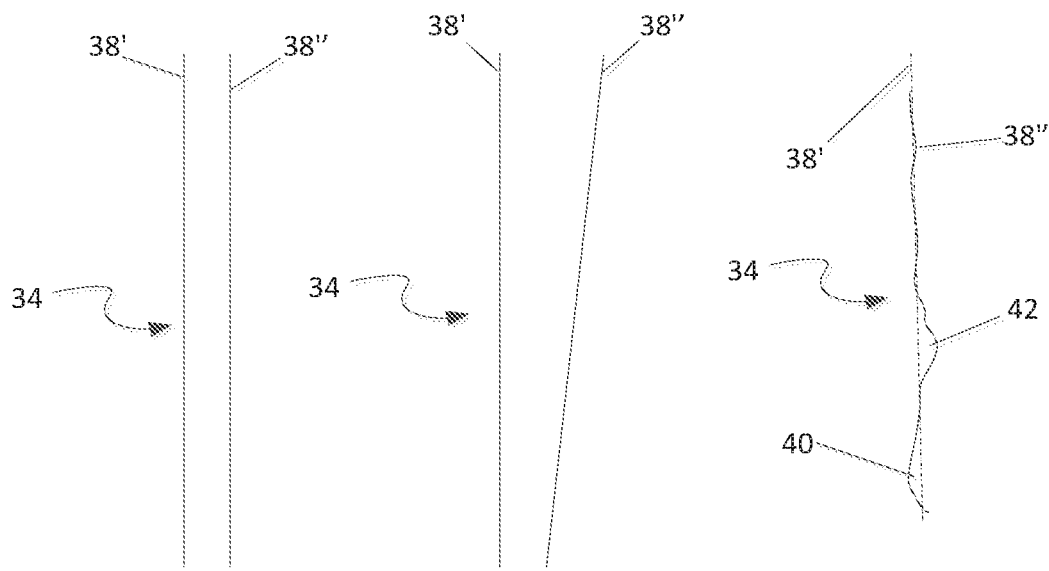
FIGS. 6A-6C are schematic representations of characteristics of device edges that may be quantified to assist in controlling a singulation process.

Once a transform or composite image is created, distances between the segments 38' and 38" may be measured. This may be done in a piecewise manner, in which a lateral distance between the segments is measured for each vertical position. FIG. 6A illustrates a nominally perfect arrangement of segments 38' and 38". In this Figure, the segments are straight and parallel, which is the ideal arrangement of the segments. FIG. 6A may represent actual peripheral edges 34 of a substrate 20 or segments 38' and 38". The distance between the segments 38' and 38" is of interest as this can relate directly to the width of a saw used to singulate the substrate 20. This distance can also relate the tension in the film of a support. Improper tension in the film of a support may cause singulated devices 30 to be pulled away or toward one another such that the distance between singulated devices 30 is too small, too large, or uneven as seen in FIG. 6B.

FIG. 6C illustrates schematically an embodiment in which a composite or superimposed image including segments 38' and 38" is formed. In this Figure, segment 38' is represented by a straight dashed line and segment 38" is represented by the curvilinear solid line. FIG. 6C can also represent a line of best fit (dashed line) that has been computed for a curvilinear segment 38".

Considering first the composite image representation shown in FIG. 6C, one can see that in the upper portion of the composite image, the segments 38' and 38" are substantially collinear. Note that by using a straight line to represent segment 38', variation between the two segments is highlighted; segments 38 are often not perfectly straight and are more often somewhat curvilinear, particularly at very small scales. The lower portions of the segments 38' and 38" have significant variation that is indicative of a problem with the singulation process. Measuring a lateral/horizontal distance between the segments 38' and 38" at selected vertical positions highlights the problems inherent in the singulation process that created these edges 34. In the upper portion of the segments, the distances between the segments are relatively small and as preferred, relatively near to zero. In the lower portion of the segments 38' and 38", the distances vary much more and can be quite large. In fact, gaps 40 and 42 may be clearly seen. If measurements are taken relative to an arbitrarily selected segment 38, one may easily determine whether gaps 40, 42 are likely to be chips or delaminations.

One may also compute a standard deviation as between the segments 38' and 38" or between a line of best fit (dashed line) and a segment (solid line) by determining lateral distances between the lines at selected vertical positions (note that these positions may be at each pixel row or at a smaller subset of selected positions) and using these values or their absolute value to determine a variability of the edges 34 relative to one another or relative to a line of best fit. High variability at a selected resolution or scale may provide a good indicator of the quality of the singulation process. In fact, measured distances that exceed a standard deviation or a threshold set to represent some level of singulation quality may be used to determine whether a deviation from a nominal contour is discrepant or not.

Figure 7:
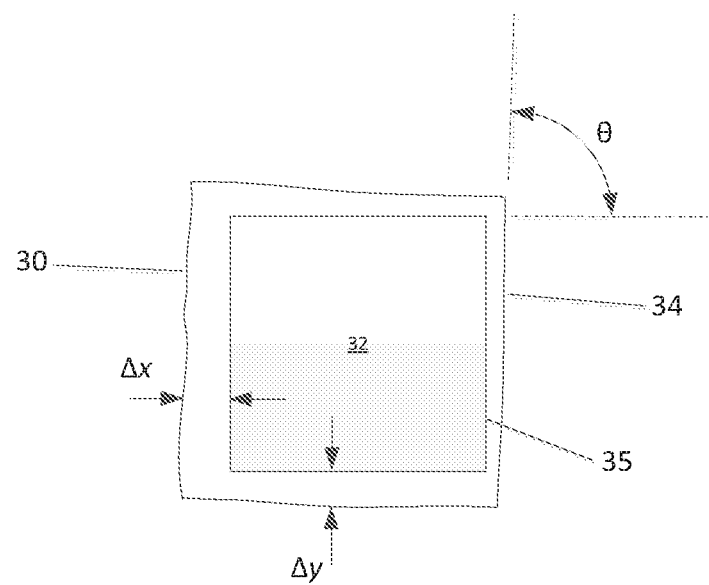
FIG. 7 is a schematic representation of a device relative to its edges.

FIG. 7 illustrates another aspect of the present invention. Devices 30 have central areas 32 in which various types of active circuitry or MEMS structures may be present. Preferably peripheral edges 34 of the device 30 will be parallel and preferably uniformly spaced with the peripheral edges 35 of the central area 34. In much the same way as described above with respect to assessing segments 38, one may identify segments of the peripheral edges 35 of the central area and compare these with segments 38 of the peripheral edge of the device 30. As the central area 32 is often formed using a lithographic technique, its peripheral edges 35 are often fairly linear. In any case, the shape of the peripheral edges 35 of the central area 32 will have a known, nominal shape. Measurement of distances $\Delta X$, $\Delta Y$, and $\theta$ as between the edges of the device 34 and the central areas 35 can indicate whether there is a misalignment in the singulation process. Furthermore, variation of the values $\Delta X$, $\Delta Y$, and $\theta$ over an array of devices 30 on a substrate 20 may be indicative of misalignment of the devices 30 themselves or of a progressive alignment error in the device that is carrying out the singulation. These errors may be indicative of problems earlier in time such as, for example, improper formation of composite substrates (reconstituted wafers such as dies embedded in epoxy or mounted on a carrier substrate) or perhaps a misalignment of the crystalline structure of a substrate 20 with the devices 30 formed thereon.

Figure 5:
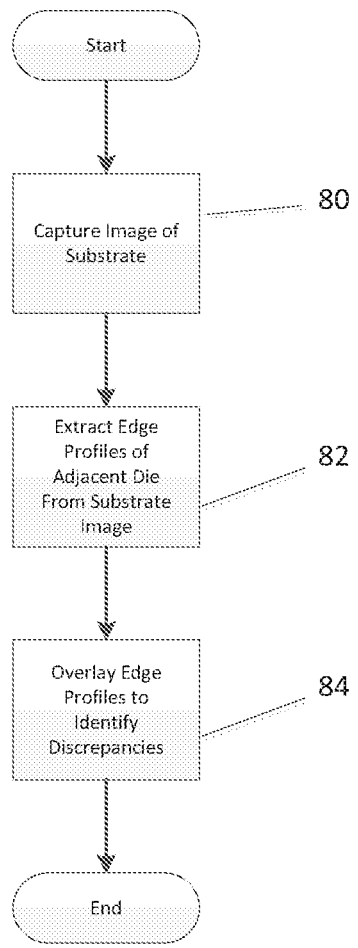
FIG. 5 is a flowchart illustrating one method according to the present invention.

One embodiment of the process whereby the present invention is carried out is shown in FIG. 5. In step 80, system 50 is used to capture images of devices 30 on a support or substrate. In step 82, the captured images are analyzed by the processor coupled to system 50 to identify edges 34 and if desired, edges 35. Segments of edges 34 and 35 may be extracted for comparison as described above. In step 84, the extracted segments of edges 34 and/or 35 are overlaid or compared to identify discrepancies and to quantify the quality of the singulation process. The output of the process shown in FIG. 5 is then used to improve the singulation process whereby devices 30 are separated from a substrate 20 and to potentially identify substrates 30 which are of questionable utility or quality based on the presence of discrepancies in their edges from the singulation process.

In one embodiment, the presence of gaps 40, 42 which may represent chips or delaminations, may be indicative of a problematic singulation process. Large variations or standard deviations in a segment 38 may likewise be indicative of such problems. Variations in the distance or angular orientation between the peripheral edges 34 and 35 may be indicative of a misalignment in the singulation process. These data may be fed back to the singulation process to improve alignment, feed rates, tool maintenance, film application techniques and the like.

CONCLUSION

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of characterizing a singulation process comprising:
   identifying a profile of a predetermined portion of a peripheral edge of a first IC device that has been separated from a substrate;
   identifying a profile of a predetermined portion of a peripheral edge of a second IC device that has been separated from the substrate, the predetermined portion of the peripheral edge of the second IC device being retained adjacent to the predetermined portion of the peripheral edge of the first IC device during the steps of identifying; and,
   comparing the profiles of the predetermined portions of the peripheral edge of the first and second IC devices to identify one of a gap between the profiles and an overlap between the profiles, if any.

2. The method of characterizing a singulation process of claim 1:
   wherein prior to the steps of identifying, the method further comprising separating at least a portion of a contiguous substrate into at least the first IC device and the second IC device such that the first and second IC devices having adjoining edges;
   wherein the steps of identifying include:
      capturing at least one image of each of the adjoining edges of the first and second IC devices;
      establishing a profile of each of the adjoining edges of the first and second IC devices;
   wherein the step of comparing includes:
      overlaying the profiles of the adjoining edges;
      identifying discrepant portions of the adjoining edges from the overlaid profiles of the adjoining edges, if any; and,
   the method further comprising modifying the separating step and/or an apparatus for carrying out the separating step to reduce the likelihood that the separating step will result in a discrepant portion of subsequently formed adjoining edges of at least another first IC device and another second IC device.

3. The method of characterizing a singulation process of claim 2 wherein the step of identifying discrepant portions further comprises determining whether a discrepancy between the profiles of the adjoining edges is indicative of one of a chip and a delamination.

4. The method of characterizing a singulation process of claim 3 wherein a chip is determined by identifying a gap between the profiles of the adjoining edges.

5. The method of characterizing a singulation process of claim 3 wherein a delamination is determined by identifying an overlap between the profiles of the adjoining edges.

6. The method of characterizing a singulation process of claim 2, wherein during the step of separating, the contiguous substrate is secured to a support, and further wherein throughout the steps of identifying, the first and second IC devices remain secured relative to one another by the support.

7. The method of characterizing a singulation process of claim 1 further comprising:
   determining a roughness of each of the profiles of the predetermined portions of the peripheral edge of the first and second IC devices;
   determining whether the roughness of either of the profiles of the predetermined portions of the peripheral edge of the first and second IC devices exceeds a predetermined threshold that defines an acceptable level of quality; and,
   identifying whether the roughness of either of the profiles of the predetermined portions of the peripheral edge of the first and second IC devices differs by more than a predetermined threshold which defines an acceptable level of quality.

8. The method of characterizing a singulation process of claim 1 further comprising:
   determining a line of best fit for each of the profiles of the predetermined portions of the peripheral edge of the first and second IC devices; and,
   determining whether the lines of best fit for each of the profiles of the predetermined portions of the peripheral edge of the first and second IC devices are out of parallel to one another by more than a predetermined threshold which defines an acceptable level of quality.

9. The method of characterizing a singulation process of claim 8 wherein the line of best fit is selected from a group consisting of linear and curvilinear.

10. The method of characterizing a singulation process of claim 1 further comprising:
    identifying a boundary of a patterned area of at least one of the first and second IC devices; and,
    determining a relative distance and orientation between the boundary and the profile of the predetermined portion of the peripheral edge of the respective IC device.

11. An integrated circuit device manufactured by the process of claim 1.

12. The method of characterizing a singulation process of claim 1, wherein throughout the steps of identifying, the first and second IC devices are secured relative to one another by a support.

13. The method of characterizing a singulation process of claim 2, wherein the overlaying step includes forming a known relationship between the profiles of each of the adjoining edges of the first and second IC devices.

14. The method of characterizing a singulation process of claim 2, wherein the overlaying step includes generating a transform that relates a position and orientation of a segment of the profile of the first IC device with a corresponding segment of the profile of the second IC device.

15. The method of characterizing a singulation process of claim 2, wherein the modifying step includes modifying at least one of a singulation process feed rate, temperature, pressure and alignment.

16. The system of claim 13 further comprising:
    means for identifying a boundary of a patterned area of at least one of the first and second IC devices; and means for determining a relative distance and orientation between the boundary and the profile of the predetermined portion of the peripheral edge of the respective IC device.

17. The system of claim 13, wherein the means for identifying is configured to operate while the first and second IC devices are secured relative to one another by a support.

18. The system of claim 13, wherein:
the means for identifying includes:
  means for capturing at least one image of each of the adjoining edges of the first and second IC devices, and
  means for establishing a profile of each of the adjoining edges of the first and second IC devices; and
the means for comparing includes:
  means for overlaying the profiles of the adjoining edges, and
  means for identifying discrepant portions of the adjoining edges from the overlaid profiles of the adjoining edges, if any.

\* \* \* \* \*